United States Patent [19]

O'Shaughnessy et al.

[11] Patent Number: 4,859,873

[45] Date of Patent: Aug. 22, 1989

[54] CMOS SCHMITT TRIGGER WITH INDEPENDENTLY BIASED HIGH/LOW THRESHOLD CIRCUITS

[75] Inventors: Timothy G. O'Shaughnessy, Norco; Richard W. Hull, Laguna Hills, both of Calif.

[73] Assignee: Western Digital Corporation, Irvine, Calif.

[21] Appl. No.: 74,905

[22] Filed: Jul. 17, 1987

[51] Int. Cl.[4] .......................... H03K 3/29; H03K 5/153
[52] U.S. Cl. ...................................... 307/290; 307/279; 307/359; 307/360; 307/363
[58] Field of Search ............... 307/290, 445, 448, 354, 307/359, 360, 363

[56] References Cited

U.S. PATENT DOCUMENTS

| | | | |
|---|---|---|---|
| 4,394,587 | 7/1983 | McKenzie et al. | 307/359 |
| 4,438,349 | 3/1984 | Shoji | 307/354 |
| 4,490,627 | 12/1984 | Moench et al. | 307/290 |
| 4,503,340 | 3/1985 | Linder | 307/359 |

FOREIGN PATENT DOCUMENTS

| | | | |
|---|---|---|---|
| 0179019 | 10/1983 | Japan | 307/290 |
| 0077513 | 5/1985 | Japan | 307/290 |
| 0152117 | 8/1985 | Japan | 307/290 |

Primary Examiner—Stanley D. Miller
Assistant Examiner—Timothy P. Callahan
Attorney, Agent, or Firm—Spensley Horn Jubas & Lubitz

[57] ABSTRACT

A Schmitt trigger circuit with independently biased threshold sections includes a drive disabling switch for blocking one of the threshold sections from driving a logic node toward a predetermined logic state. The drive disabling switch is selectively operated so that unidirectional sensitivity to the crossing of a threshold level belonging to its corresponding one threshold section is obtained.

18 Claims, 5 Drawing Sheets

CMOS SCHMITT TRIGGER WITH INDEPENDENTLY BIASED HIGH/LOW THRESHOLD CIRCUITS

BACKGROUND OF THE INVENTION

1. Field of the Invention

The present invention relates to unidirection threshold detectors such as Schmitt triggers and more particularly to Schmitt trigger circuits utilizing complementary metal oxide semiconductor (CMOS) technology.

2. Description of the Prior Art

A Schmitt trigger is a circuit that provides a digital output signal of either a logic HIGH or logic LOW state in response to the level of a supplied input signal. When the input signal crosses a respective one of an upper and lower threshold level, $V_H$ and $V_L$, in a specified direction, the output level changes from a corresponding first of the LOW/HIGH logic states to the second. The logic states of the digital output signal can be represented by a variety of preselected signal attributes such as for example, by a binary set of voltage levels or current levels.

Figure 1:
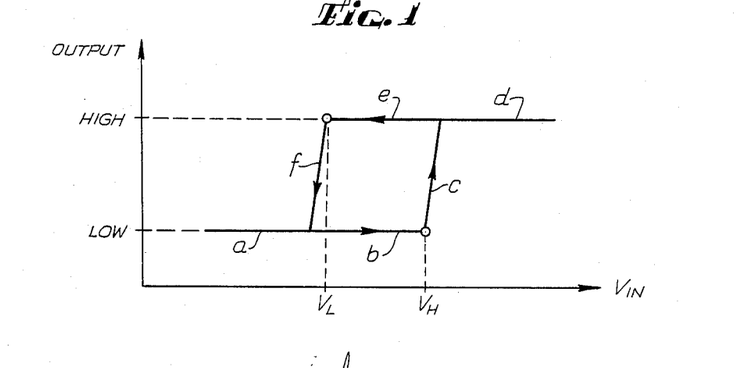
FIGS. 1 is a diagram showing the hysteresis loop of a Schmitt trigger circuit.

The basic operation of a Schmitt trigger is illustrated by reference to the hysteresis loop shown in FIG. 1. The output of a Schmitt trigger remains at a logic LOW while the level of an input signal $V_{in}$ remains in a first range a below the lower threshold level $V_L$. When the input signal crosses the upper threshold level $V_H$ in an upwardly direction, as shown by the upwardly directed arrow c in FIG. 1, the output switches to the logic HIGH state. The output remains HIGH as long as the input signal remains in a second range d above the upper threshold level $V_H$. If the input signal is reduced downwardly (f) to cross past the lower threshold level $V_L$, the output switches back to the logic LOW state.

Figure 2A:
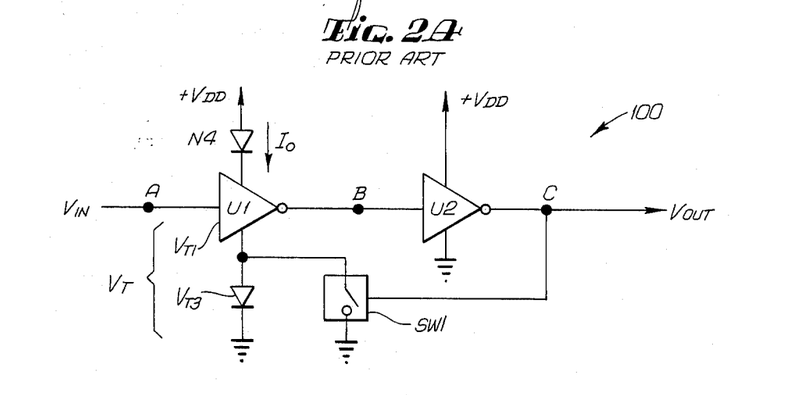
FIG. 2A is a block diagram of a previously known Schmitt trigger circuit.
Figure 2B:
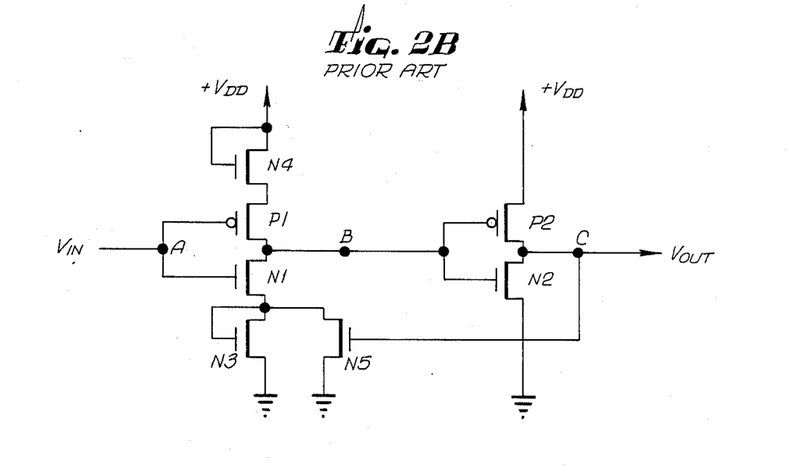
FIG. 2B is a schematic diagram of the Schmitt trigger shown in FIG. 2A.

FIGS. 2A and 2B are respectively a block diagram and a schematic diagram of a previously known Schmitt trigger circuit 100. The circuit 100 comprises a pair of CMOS inverter stages, U1 and U2, that are arranged in a feedback configuration. The configuration includes respective input, intermediate, and output nodes; A, B and C. The first inverter U1 is formed of complementary n-channel and p-channel MOSFET's, N1 and P1. U1 is biased during a midpoint or output "neutral" switching phase of its operation by a neutral-point biasing current $I_o$ supplied from a voltage source $+V_{DD}$ through a pair of diode connected FET's, N3 and N4. The output of U1 switches between the logic LOW/HIGH states when an input voltage $V_{in}$, applied to an input of the first inverter U1 through the input node A, is modulated from a first level below a neutral range of levels (including the switching midpoint) to a second level above the neutral range. The upper and lower limits of the neutral range are defined by the previously mentioned upper and lower threshold levels, $V_L$ and $V_H$.

In order to drive the output of U1 (node B) LOW, the input voltage $V_{in}$ must exceed an upper threshold determining level $V_{TH}=V_{T1}+V_{T3}$ which is formed by summing a first threshold voltage $V_{T3}$ belonging to the diode connected FET N3 and a second threshold voltage $V_{T1}$ belonging the n-channel MOSFET N1. The threshold voltages, $V_{T1}$ and $V_{T3}$, are input voltages required by the first inverter U1 and the diode connected FET N3, respectively, for each to conduct a current having at least the magnitude of the neutral-point biasing current $I_o$.

The input of the second inverter U2 is connected to the intermediate node B so as to be driven by the output of the first inverter U1. U2 produces an output voltage $V_{out}$ at the output node C. A switch SW1, which is formed an n-channel FET N5, is connected in parallel across N3 such that the switch SW1 will short the diode connected transistor N3 when the output node C goes HIGH. When the diode connected transistor N3 is shorted by the FET switch N5, the critical input voltage required for supporting the neutral-point biasing current $I_o$ switches from the upper threshold determining level, $V_{TH}=V_{T1}+V_{T3}$, to a lower threshold determining level, $V_{TL}=V_{T1}$ As a consequence, the turn-off/turn-on point of N1 is shifted to a lower level. N1 can therefore remain actively turned "on" to clamp the intermediate node B to the logic LOW state even when the input level $V_{in}$ falls under $V_{TH}=V_{T1}+V_{T3}$. N1 does not release the intermediate node B from the LOW state until $V_{in}$ drops to the lower threshold determining level $V_{TL}=V_{T1}$ or below.

The Schmitt trigger circuit 100 of FIGS. 2A and 2B has a number of drawbacks. The effective lower and upper threshold levels, $V_L$ and $V_H$ (FIG. 1), of the circuit 100 are not easily adjusted to conform to the voltage requirements of a specific logic design. For example, when a TTL (transistor-transistor-logic) circuit is to be used to drive the Schmitt trigger 100, the lower threshold voltage $V_L$ should be set to 0.8 volts and the upper threshold voltage $V_H$ should be set to 2.0 volts. A hysteresis gap of 1.2 volts between the upper and lower threshold levels is usually required in such circuits so that the Schmitt trigger will have a desired level of noise immunity. Unfortunately, this requirement is very difficult to realize with mass produced silicon chips built around CMOS technology. In such chips, if practical levels of output drive currents are to be realized over a wide range of fabrication process variations, $V_{T3}$ must be nominally set to just above 1.0 volts and $V_{T1}$ must also on average be set slightly greater than 1.0 volts. As a consequence, the average lower threshold voltage $V_L=V_{T3}$ of such mass produced IC's turns out to be significantly higher than 0.8 volts and the upper threshold voltage $V_H$ is on average substantially greater than 2.0 volts. The hysteresis gap is typically less than 1.2 volts so that desired levels of noise immunity cannot be obtained. The CMOS circuit 100 of FIGS. 2A and 2B is therefore generally incompatible with the requirements of other logic families such as the TTL family.

Another drawback of the circuit 100 is that the precise values of the upper and lower threshold levels, $V_H$ and $V_L$, vary from one wafer processing batch to the next so that it is difficult to produce a desirable yield of chips having certain pre-selected threshold levels. The present invention overcomes the above drawbacks.

SUMMARY OF THE INVENTION

The present invention avoids the shortcomings of the prior art by providing a Schmitt trigger circuit with independently biased threshold sections for determining the upper and lower threshold levels of such a circuit.

In one embodiment of the invention, the respective outputs of a first, low threshold, CMOS inverter and a second, high threshold, CMOS inverter are supplied to a CMOS NOR gate. The inputs of the inverters are tied to a common input node which receives a supplied input voltage. A power supply delivers drive current to the outputs of the first and second inverters. The output of the NOR gate is coupled to operate a drive disabling switch that is interposed between the power supply and the second, high threshold inverter. The drive disabling switch is connected so as to selectively disable the high threshold inverter from driving its respective output node to a logic LOW.

The drive disabling switch is set to disable the high threshold inverter when the output of the NOR gate switches to a logic HIGH. This prevents the high threshold inverter from influencing the logic state of the NOR gate while the input voltage descends past a selected high threshold level belonging to the second inverter toward a selected low threshold level belonging to the first inverter. The first and second inverters are independently biased by a current mirroring technique such that their respective upper and lower threshold levels as well as their respective individual switching times can be individually adjusted to the needs of a specific circuit environment.

BRIEF DESCRIPTION OF THE DRAWINGS

The invention will be described with reference to the accompanying drawings wherein.

DETAILED DESCRIPTION

The following description is of the best presently contemplated modes for carrying out the invention. This description is provided for the purpose of illustrating the general principles of the invention and should not be taken in a limiting sense. The scope of the invention is better determined by reference to the accompanying claims.

Figure 3:
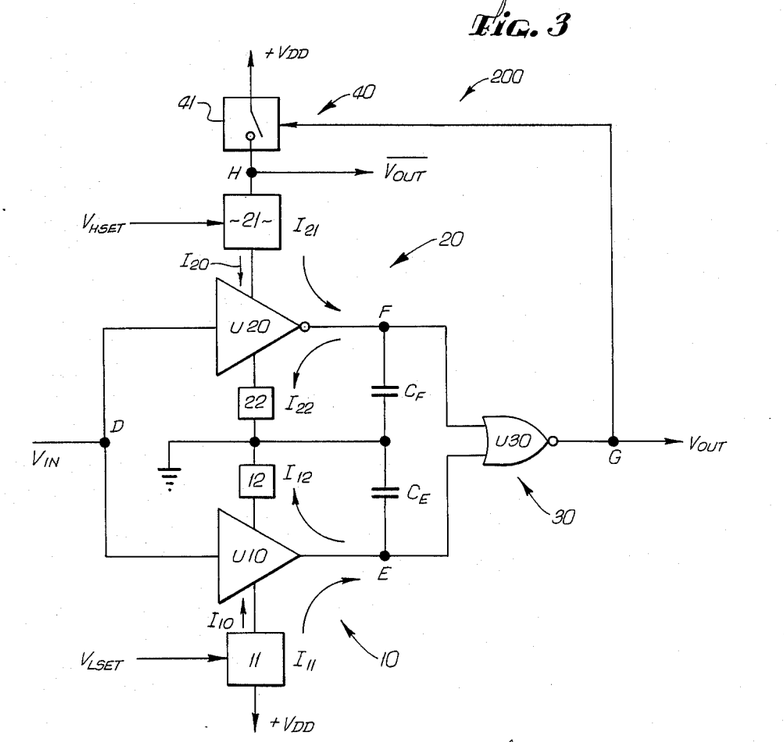
FIGS. 3 is a block diagram of a Schmitt trigger circuit in accordance with the present invention.

FIG. 3 is a block diagram of a Schmitt trigger circuit 200 in accordance with the present invention. The circuit 200 may be divided generally speaking into a lower threshold level determining stage 10, an upper threshold level determining stage 20, a logical combining stage 30, and a drive disabling stage 40 whose operations are now described.

The lower threshold level determining stage 10 comprises a first CMOS inverter U10, having an input connected to a first node D and output connected to a second node E. The lower threshold determining stage 10 also includes respective lower level charge and discharge means, 11 and 12, for biasing the first inverter between ground and a $+V_{DD}$ power rail and for carrying respective charge and discharge currents, $I_{11}$ and $I_{12}$, to and from the second node E. The lower level charge means 11 functions as a current limiter that is responsive to a supplied low threshold setting voltage $V_{LSET}$ and it sets a low threshold level $V_L$ by controlling a neutral-point biasing current $I_{10}$ that flows through U10. The low threshold voltage $V_L$ is basically a level above which an input voltage $V_{in} > V_L$ at the first node D will cause U10 to drive the second node E toward the logic LOW state by sinking both the discharge current $I_{12}$ and the neutral point biasing current $I_{10}$. If the input voltage is equal to the threshold level $V_{in} = V_L$, then only the neutral-point biasing current $I_{10}$ flows vertically between the power rail $+V_{DD}$ and ground through U10. Neither of the charge and discharge currents, $I_{11}$ and $I_{12}$ flows and U10 therefore does not affect the logic state of the second node E. When the input voltage $V_{in}$ is less than the low threshold level, $V_{in} < V_L$, it causes U10 to drive the second node E HIGH by sourcing the charge current $I_{11}$ to the second node E. The low level discharge means 12 is a voltage dropping element, such as a resistor, that may be optionally included in the circuit to elevate U10 above ground.

The upper threshold determining stage 20 includes a second CMOS inverter U20 whose input is coupled to the first node D and whose output is drivingly coupled to a third node F. Upper level charge and discharge means, 21 and 22, are interposed between the second CMOS inverter U20 and respectively between the $+V_{DD}$ power rail and ground to establish an upper threshold level $V_H$ that is of greater magnitude than the lower threshold level $V_L$. The upper level charge and discharge means, 21 and 22, also conduct respective charge and discharge currents, $I_{21}$ and $I_{22}$, to and from the third node F. The upper level charge means 21, like the lower level charge means, functions as a current limiter which by its neutral or midpoint biasing of the second inverter U20, establishes the upper threshold level $V_H$. The neutral-point biasing current $I_{20}$ of U20 is set by $V_{HSET}$. The upper level discharge means 22 is optionally included to elevate U20 above ground. A relatively high input voltage $V_{in} > V_H$ will cause U20 to drive the third node F to a logical LOW level. A relatively low input voltage $V_{in} < V_H$ will cause the second inverter U20 to try to drive the third node F to a logical HIGH level.

A switch 41, belonging to the drive disabling stage 40, is interposed between the second inverter U20 and the $+V_{DD}$ power rail to selectively disable U20 from driving the third node F HIGH. A CMOS NOR gate U30, constituting the logical combining stage 30, is provided with two inputs respectively coupled to the second and third nodes, E and F. The NOR gate U30 logically combines the logic states (HIGH/LOW) of the second and third nodes (E, F) to produce a functionally related logic state at a fourth node G. The switch 41 of the illustrated embodiment 200 is arranged to open when the fourth node G goes HIGH and to close when the fourth node G is driven LOW. A non-inverted output signal $V_{out}$ of the Schmitt trigger circuit 200 is derived at the fourth node G. An inverted output signal $\overline{V_{out}}$ is developed from a fifth node H between the switch 41 and U20 as shown in FIG. 3.

The operation of the Schmitt trigger circuit 200 will be described with reference to FIG. 1. The first hysteresis loop range a in which the input voltage is less than the lower threshold level $V_{in} < V_L < V_H$, will be considered first. In this condition the inverters, U10 and U20 are driving their respective output nodes, E and F, HIGH. The NOR gate U30 consequently produces a LOW at its output node G. The switch 41 is closed.

In a subsequent hysteresis loop range b, the voltage at the first node D is in the neutral range between the low and high threshold levels, $V_L < V_{in} < V_H$. The first inverter U10 is activated by $V_{in}$ to drive its respective output node E LOW. Since the threshold level $V_H$ of the second inverter U20 is not yet exceeded, U20 will continue to drive its respective output node F HIGH. With one of the input nodes, F, of the NOR gate still HIGH in this second condition b, the NOR gate U30 continues to output a LOW at the fourth node G. The switch 41 remains closed.

A pair of capacitors, $C_E$ and $C_F$, are shown connected between ground and the nodes E and F in FIG. 3 to respectively represent the charge retention capabilities of the second and third nodes, E and F.

These capacitors, $C_E$ and $C_F$, may be discrete devices that are purposefully inserted in the circuit 200 to establish a desired response delay or they may simply represent parasitic capacitances associated with, for example, the FET input gates of the CMOS NOR gate U30. From inspection of the circuit 200 it will be understood that if the third node F is to be driven LOW after its capacitor $C_F$ is charged to a HIGH level, a discharge current $I_{22}$ must be pumped out of its respective capacitor $C_F$. For the third node F to go HIGH, a charge current $I_{21}$ must be pumped into $C_F$.

In the next relevant hysteresis loop range d (FIG. 1), the input voltage surpasses the high threshold level so that $V_L < V_H < V_{in}$. Both inverters, U10 and U20, now drive their respective output nodes E and F, LOW. The NOR gate U30 produces a HIGH at the fourth node G. The switch 41 opens in response.

If the input voltage $V_{in}$ drops below the upper threshold level $V_H$ back into the neutral range so that a fourth condition e (FIG. 1) is created wherein $V_L < V_{in} < V_H$ with $V_{in}$ descending, the second inverter U20 tries to charge the capacitor $C_F$ of the fourth node F toward the HIGH state. The second inverter is blocked from doing so however because the switch 41 is now open and the charge current $I_{21}$ is therefore prevented from flowing to the fourth node. The fourth node F consequently remains LOW and the output of the NOR gate U30 remains HIGH.

When the first hysteresis loop condition a is reentered by the descending input voltage so that $V_{in} < V_L < V_H$, the first inverter U10 is activated so as to supply a charge current $I_{11}$ to its corresponding second node capacitor $C_E$. The second node E consequently goes HIGH. In response, the NOR gate U30 generates a LOW at the fourth node G. The switch 41 closes and the circuit 200 is set to repeat the loop sequence b, c, d, e, f, a, for the next cycling of the input voltage $V_{in}$.

The charge means, 11 and 21, control not only the neutral-point bias currents, $I_{10}$ and $I_{20}$, of their respective inverters, U10 and U20, but also the charge time of their respective output node capacitances, $C_E$ and $C_F$. The charge time can be shortened if desired by increasing the magnitude of the respective charge currents, $I_{11}$ and $I_{22}$. The threshold voltages, $V_L$ and $V_H$, may be set independently of the charge time of their respective threshold determining stages by appropriate sizing of the channel width/length dimensions of the active devices (MOSFET's) used to form the CMOS inverters, U10 and U20. The design parameters for changing the biasing current of an MOSFET (metal-oxide-semiconductor field-effect-transistor) while the gate voltage of such an MOSFET remains unchanged are well known in the field.

Figure 4:
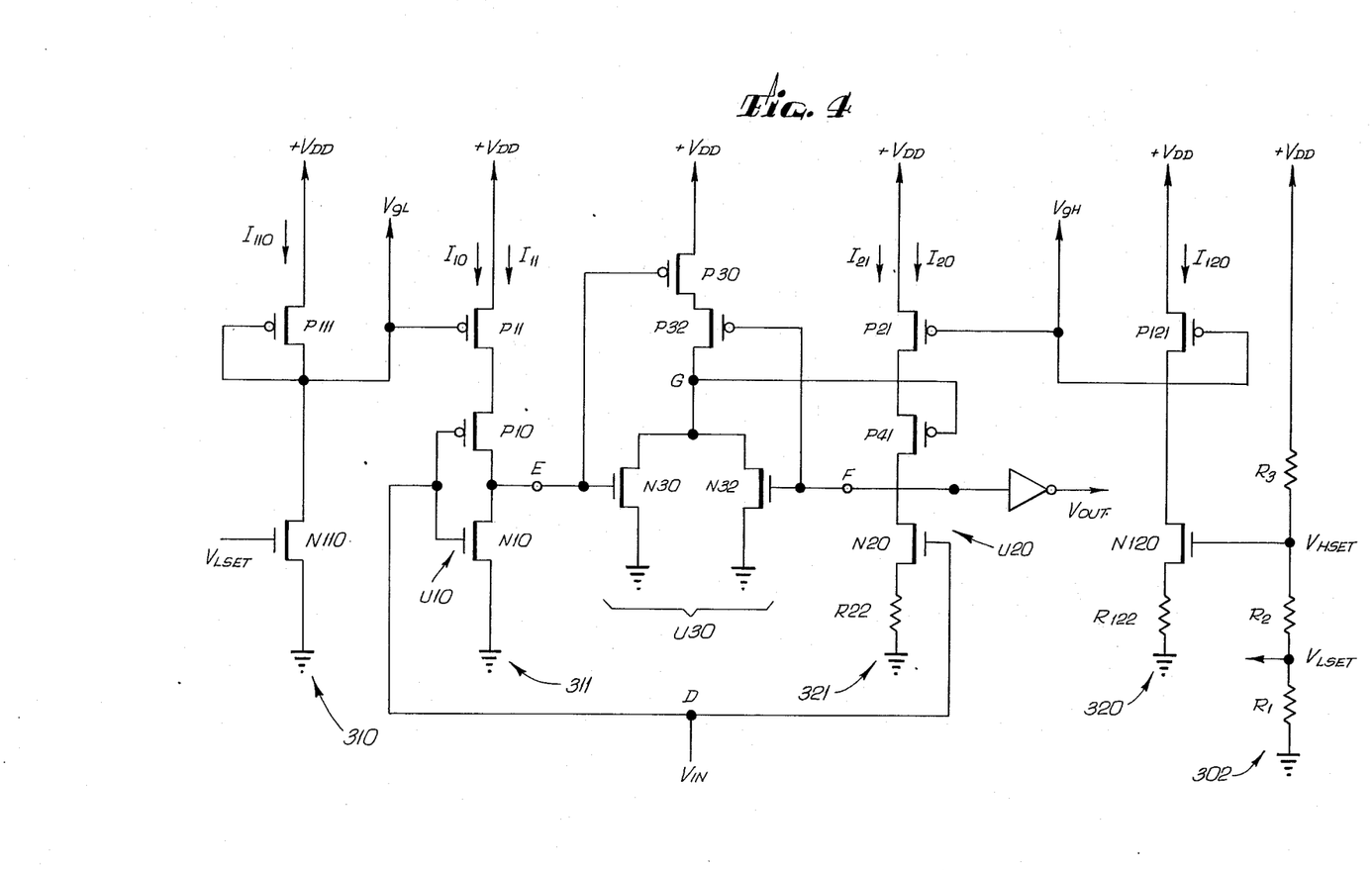
FIG. 4 illustrates a CMOS embodiment of the present invention.

Referring to FIG. 4, a CMOS embodiment 300 of the present invention will now be described. Reference numerals corresponding to the reference numerals used in FIG. 3 denote corresponding elements in FIG. 4. An input node D, first and second intermediate nodes, E and F, a primary output node G, and a secondary output node H' are provided in the circuit 300 of FIG. 4. A first (CMOS) inverter U10 comprising an n-channel MOSFET N10 and a p-channel MOSFET P10 is disposed between the input node D and the first intermediate node E. A CMOS NOR gate U30 is provided in the circuit with the gates of a first complementary pair of n-channel and p-channel transistors, N30 and P30, connected to the first intermediate node E, and the gates of a second complementary pair of n-channel and p-channel MOSFET's, N32 and P32, connected to the second intermediate node F. A second inverter U20' is formed by an n-channel transistor N20 whose gate is coupled to the input node D. The drain of N20 is connected to the second intermediate node F. Biasing transistors P11 and P21 supply respective neutral-point biasing currents, $I_{10}$ and $I_{20}$, to the n-channel transistors N10 and N20. The biasing transistors, P11 and P21, also supply respective charging currents, $I_{11}$ and $I_{21}$, for charging the first and second intermediate nodes, E and F, from a discharged state to the logic HIGH state. The charging currents, $I_{11}$ and $I_{12}$, pass respectively through the p-channel transistor P10 of the CMOS inverter U10 and through a p-channel switch P41 that is provided interposed between the drains of P21 and N20. The gate of P41 is coupled to the primary output node G of the NOR gate U30 (drains of N30 and N32) in a manner such that the switch P41 is nonconductive when the node G is HIGH and the switch P41 is closed to allow the passage of current when the primary output node G goes LOW (i.e. to the ground level).

The circuit of FIG. 4 functions as a Schmitt trigger in generally the same manner as does the circuit of FIG. 3. N10 and N20 can be activated by a suitably high input voltage $V_{in}$ to drive their respective intermediate nodes, E and F, LOW. A biasing resistor $R_{22}$ is interposed between ground and the source of N20 in order to elevate the source voltage of N20 above ground. P10 can be activated by an appropriately supplied low input voltage $V_{in}$ to charge the first intermediate node E HIGH. The second intermediate node F may be charged to a logic HIGH state when the switch P41 is rendered conductive by a LOW at the primary output node G. An output signal $V_{out}$ is produced by a CMOS inverter U40 whose input is connected to the secondary output node H' (and to the second intermediate node F).

The entire circuit 300 of FIG. 4 is fabricated on an integrated circuit (IC) chip in a manner such that similar devices on the IC chip are exposed to substantially identical fabrication processes. As a consequence, identical or size scaled duplicates of any one transistor can be formed on the IC chip. Duplicate transistors have substantially identical input/out ($V_{GS}/I_{DS}$) transfer characteristics. The technique of current mirroring may be exploited to set the neutral-point biasing currents, $I_{10}$ and $I_{20}$, equal to values corresponding to process-invariant gate voltages. When the neutral point biasing currents $I_{10}$ and $I_{20}$ flow, the respective n-channel inverters, N10 and N20, will because of mirror symmetry have neutral-point gate voltages that are substantially equal to a respective pair of low and high threshold setting voltages, $V_{LSET}$ and $V_{HSET}$, supplied to mirror duplicated portions of the IC chip.

A first current mirroring leg 310 is provided in the circuit 300 to mirror the vertical leg 311 formed by the biasing transistor P11, the p-FET P10, and the n-channel inverter N10. The first current mirroring leg 310 includes an n-channel FET N110 provided in series with a diode connected p-channel FET P111. N110 is proportionally sized to be either an identical or a scaled duplicate of N10. P111 is correspondingly proportioned to be a duplicate of P11. Preferably, N110 and P111 have channel widths that are substantially smaller than the channel widths of N10 and P11 so that a first mirror biasing current $I_{110}$ flowing through the first current mirroring leg 310 will be a scaled down duplicate of the neutral-point biasing current $I_{10}$ of the first vertical leg 311. The low threshold setting voltage $V_{LSET}$ is applied to the gate of N110 to cause the first mirror biasing current $I_{110}$ to flow through the first current mirroring leg 310.

The diode connected FET P111 conducts the first mirror biasing current $I_{110}$ and in response produces a low gate biasing voltage $V_{gL}$ at its gate and drain. The low gate biasing voltage $V_{gL}$ is supplied to the gate of P11 and, as will be shortly described, can also be supplied to other biasing transistors (which function like P11) of additional Schmitt trigger circuits on the IC chip. With the low gate voltage $V_{gL}$ applied to its gate, the biasing transistor P11 forces the neutral-point biasing current $I_{10}$ it supplies to the drain of the n-channel inverter N10 to be a duplicate of the first mirror biasing current $I_{110}$ when $V_{in}$ is at a neutral point level corresponding to $V_{LSET}$. As long as the input voltage $V_{in}$ is relatively low at the neutral point, the p-channel transistor P10 will be turned on to conduct the neutral point biasing current $I_{10}$. The inverter N10 has to sink a current at least equal to the magnitude of the biasing current $I_{10}$ in order to drive the first intermediate node E LOW. Since N10 is a duplicate of N110, the gate voltage of N10, by reason of mirror symmetry, must equal or exceed the low threshold setting voltage $V_{LSET}$ in order to fully sink the neutral-point biasing current $I_{10}$. Accordingly, the first intermediate node E will not be discharged to a LOW state by N10 until the input voltage $V_{in}$ rises to exceed the low threshold setting voltage $V_{LSET}$. The threshold voltage for switching the output state (node E) of the first CMOS inverter U10 is therefore approximately equal to $V_{LSET}$.

A second current mirroring leg 320 is provided in the circuit 300 to mirror a second vertical leg 321 formed by the biasing transistor P21, the n-channel inverter N20 and the biasing resistor $R_{22}$. (Switch P41 of the second vertical leg 321 is closed when the biasing current $I_{20}$ flows. For most cases, its voltage drop contribution to the leg 321 can be ignored.) The second current mirroring leg 320 comprises an n-channel FET N120, a diode connected p-channel FET P121 and a resistor $R_{122}$, all of which are proportionally scaled replicas of their corresponding devices, N20, P21 and $R_{22}$ of the second vertical leg 321. A high threshold setting voltage $V_{HSET}$ is applied to the gate of N120 to induce a mirror biasing current $I_{120}$ through the second current mirroring leg 320. The diode connected FET P121 responds by producing a high gate biasing voltage $V_{gH}$ at its gate and drain. The high gate biasing voltage $V_{gH}$ is applied to the gate of the biasing transistor P21 to thereby cause P21 to supply the neutral-point biasing current $I_{20}$ to the n-channel inverter N20 when the gate voltage of N20 is at a neutral point. Preferably, the components of the second current mirroring leg 320 are sized substantially smaller than the components of the second vertical leg 321 so that the mirror biasing current $I_{120}$ will be a scaled down replica of the neutral-point biasing current $I_{20}$.

Because of the mirror symmetrical arrangement between the legs 320 and 321, the input voltage $V_{in}$ at the gate of the inverter N20 must exceed $V_{HSET}$ for the inverter N20 to sink a current equal to or exceeding the supplied neutral-point biasing current $I_{20}$. Accordingly, the critical switching voltage for causing the inverter N20 to switch the logic state of its respective intermediate node F between the HIGH/LOW states becomes equal to the supplied high threshold setting voltage $V_{HSET}$. As with the case of the low gate biasing voltage $V_{gL}$, the high gate biasing voltage $V_{gH}$ can also be supplied to other biasing transistors (functioning like P21) of additional Schmitt triggers on the IC chip so that all such triggers will have their low and high threshold levels, $V_L$ and $V_H$, respectively set equal to $V_{LSET}$ and $V_{HSET}$.

The low and high threshold setting voltages $V_{LSET}$ and $V_{HSET}$, can be produced by a precision voltage divider 302 that is provided on the IC chip as a plurality of series connected resistive elements, $R_1$, $R_2$ and $R_3$ as shown in FIG. 4. The precision voltage divider 302 may be connected to the power rail $+V_{DD}$ of the IC chip so that $V_{LSET}$ and $V_{HSET}$ will be fractional duplicates of the power supply voltage $+V_{DD}$ or, alternatively, the precision voltage divider 302 may be coupled to an on-chip precision voltage reference so that the low and high threshold setting voltages, $V_{LSET}$ and $V_{HSET}$, are established independently of the power supply voltage $+V_{DD}$.

Figure 5:
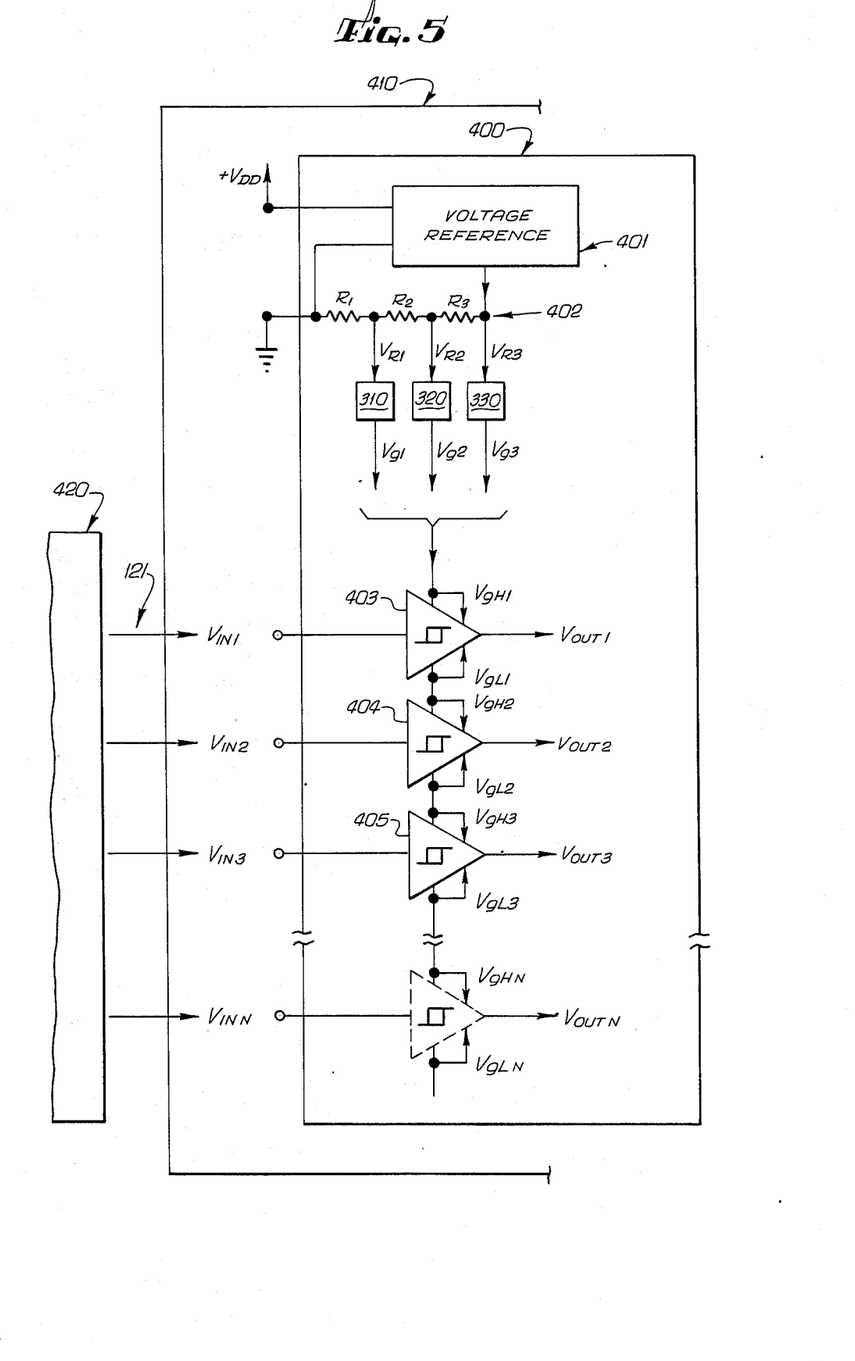
FIG. 5 is a block diagram of an on-chip biasing scheme for a plurality of Schmitt triggers.

FIG. 5 illustrates the latter arrangement wherein a precision voltage reference 401, using for example a band gap device for developing its reference voltage, is incorporated into an IC chip 400 to generate a relatively high reference voltage $V_{R3}$. An on-chip voltage divider 402 produces an additional plurality of reference voltages such as for example the illustrated low reference voltage $V_{R1}$ and the intermediate reference voltage $V_{R2}$. The reference voltages $V_{R1}$–$V_{R3}$ are fed to a plurality of current mirroring circuits 310, 320 and 330 which generate respective gate biasing voltages $V_{g1}$, $V_{g2}$ and $V_{g3}$. Selected ones of the gate biasing voltages $V_{g1}$–$V_{g3}$ are supplied as the high and low threshold setting voltages, $V_{gHn}$ and $V_{gLn}$, of a plurality of Schmitt trigger circuits, 403, 404, 405, etc. that are designed in accordance with the principles of the circuit 300 shown in FIG. 4. The biasing lines which supply the gate biasing voltages $V_{g1}$–$V_{g3}$ to the Schmitt triggers draw little or no power since they are connected to insulated gate inputs of the Schmitt triggers 403, 404, 405, etc. Currents flowing through the voltage divider 402 and the mirroring circuits 310, 320, 330 can be scaled down to relatively low levels so that the steady state power requirements of the plural Schmitt triggers may be minimized.

The IC chip 400 is mounted on a first circuit board 410 and connected to the ground and power rail $+V_{DD}$ of that printed circuit board 410. A second printed circuit board 420, which does not share the power supply $+V_{DD}$ of the first board 410, is coupled to the first printed circuit board 410 through a transmission cable 421 to supply a plurality of digital input signals, $V_{in-1}$ through $V_{in-N}$, to the Schmitt triggers 403, 404, 405, etc. Since the reference levels $V_{R1}$, $V_{R2}$ and $V_{R3}$ are established independently of the power supply $+V_{DD}$ by the precision voltage reference 401, the thresholds of the triggers 403, 404, 405, etc. do not depend on the precision of the first board's power supply $+V_{DD}$. The chip 400 can therefore be manufactured to respond to input signals $V_{in-1}$ through $V_{in-N}$ in accordance with pre-established industry standards irrespective of whether the power supply $+V_{DD}$ is precisely set to a desired voltage level.

Figure 6:
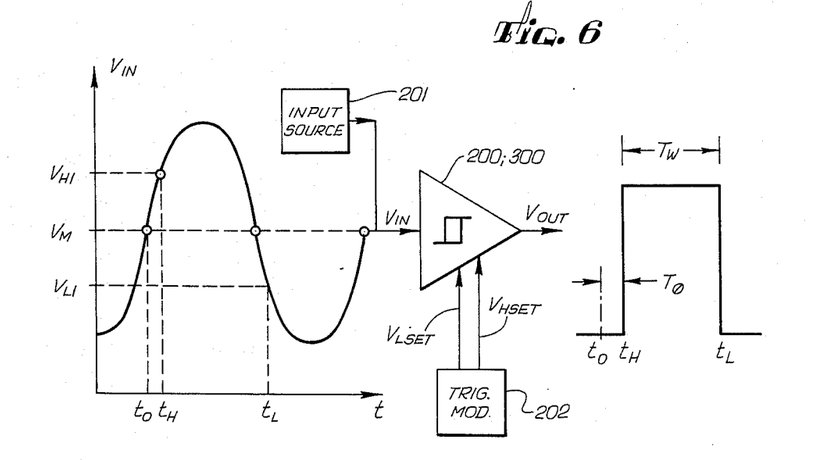
FIGS. 6 shows how a Schmitt trigger according to present invention can be used for pulse width and pulse phase modulation schemes.

It is possible to exploit the adjustable threshold capabilities of the Schmitt triggers shown in FIGS. 3 and 4 to provide a pulse width modulation function and/or a phase modulation function as will be explained by referring to FIG. 6. If the input signal $V_{in}$ of such a Schmitt trigger 200 or 300 is generated by an input source 201 as a periodic function, a sine wave for example, the output voltage $V_{out}$ will be produced in the form of a series of digital pulses having a certain pulse width $T_W$ and a certain phase displacement $T_0$ relative to a reference time mark $t_0$. The reference time mark $t_0$ is shown to occur at the mean voltage point $V_M$ of the sine wave illustrated in FIG. 6. The low and high threshold setting voltages, $V_{LSET}$ and $V_{HSET}$, are respectively set equal to a variable low voltage $V_{L1}$ and a variable high voltage $V_{H1}$ supplied by a modulation means 202. The high and low triggering points of the Schmitt trigger circuit 200 or 300 occur at corresponding times $t_H$ and $t_L$, as shown. If the variable low voltage $V_{L1}$ is modulated alone by the trigger point modulation means 202, the pulse width $T_W$ of the output pulses will vary in accordance with a transfer function defined by the waveshape of the input voltage $V_{in}$. Linear modulation can be obtained by replacing the illustrated sinusoidal input voltage with a sawtooth wave (not shown). If both the high and low voltages are modulated together, it is possible to shift the phase displacement $T_0$ of the output pulses while the pulse width $T_W$ is kept constant. Again, a sawtooth input voltage is preferred for obtaining linear phase modulation. Both phase and pulse width modulation will be obtained if only the high voltage $V_{H1}$ is modulated.

Schmitt triggers can be considered a subclass of a broader family of devices that may be characterized as having a unidirectional response sensitivity. The devices can recognize the crossing of a selected input threshold level by an input signal that is being modulated in a first direction while they exhibit an insensitivity to the crossing of the same threshold level in an opposite direction.

Figure 7:
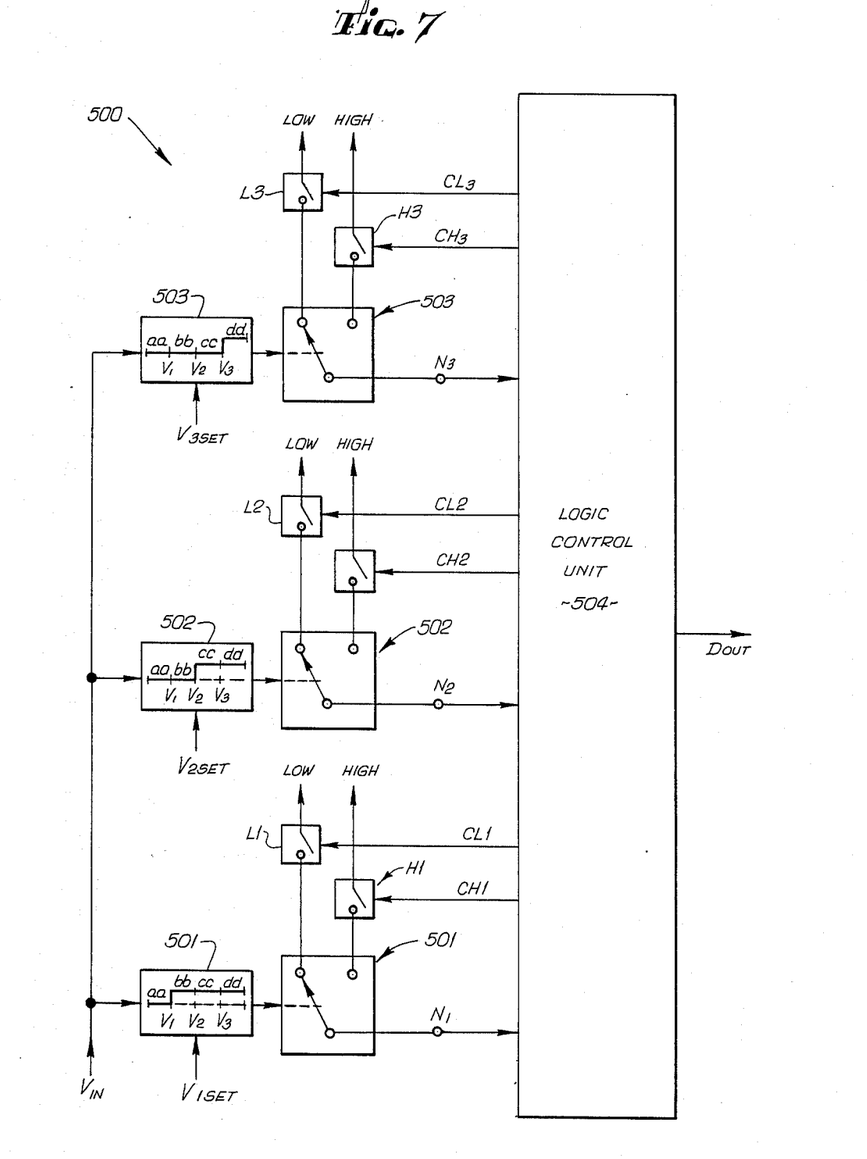
FIG. 7 shows a circuit having a plurality of adjustable threshold activated logic switches that can be selectively set for uni-directional threshold crossing sensitivity in accordance with the present invention.

FIG. 7 is a block diagram of a unidirectional threshold crossing detector 500 according to the present invention. The detector 500 is formed of a plurality of adjustable threshold activated logic switches 501, 502 and 503 and a corresponding array of drive disabling switches L1/H1, L2/H2 and L3/H3 provided for disabling the ability of the logic switches 501, 502 and 503 to drive a respective set of intermediate logic nodes, $N_1$ $N_2$ and $N_3$, either HIGH or LOW. The logic switches 501-503 are preferably formed of threshold adjustable CMOS inverters such as U10, U20 and U20' of FIGS. 3 and 4. The high and low disabling switches H1/L1-H3/L3 are preferably MOSFET's that are interposed in series between the positive and negative voltage rails (HIGH and LOW) of the logic switches 501-503. The inputs of the threshold activated logic switches 501-503 are tied together to receive a common input voltage $V_{in}$. Respective triggering voltages, $V_1$, $V_2$ and $V_3$, of the logic switches 501, 502 and 503 are established by a corresponding plurality of threshold setting voltages, $V_{1SET}$, $V_{2SET}$ and $V_{3SET}$. The triggering voltages are set such that $V_1 < V_2 < V_3$. Input voltage ranges that bracket these triggering voltages, $V_1$, $V_2$ and $V_3$, are successsively indicated in FIG. 7 as aa, bb, cc and dd.

A logic control unit 504 is operatively coupled to the intermediate logic nodes $N_1$, $N_2$ and $N_3$ to sense the logic states of those nodes. The logic control unit 504 is also coupled to the disabling switches, H1/L1-H3/L3, to selectively open and close the disabling switches in accordance with a preprogrammed logic sequence by supplying a set of control signals CH1/CL1, CH2/CL2, and CH3/CL3, respectively to the disabling switches H1/L1-H3/L3. The logic control unit 504 further outputs a data signal $D_{out}$ that is functionally related to the logic state of the intermediate nodes $N_1$, $N_2$ and $N_3$.

A method will now be described for causing the output data signal $D_{out}$ to be responsive only to the unidirectional crossing of for example, the $V_2$ triggering level. The circuit 500 is first initialized so that all disabling switches H1/L1-H3/L3 are closed by the control signals CH1/CL1-CH3/CL3 thereby enabling any of the logic switches to drive (charge) their respective output nodes, $N_1$-$N_3$, either HIGH or LOW. The HIGH/LOW conditions of the intermediate nodes $N_1$-$N_3$ define a set of intermediate logic states. When the input voltage $V_{in}$ is in the lowest range aa, all the input nodes are driven to a logic LOW. If it is desired to block the recognition of an upward crossing of the $V_2$ level, the H2 disabling switch is opened in either of the intermediate logic states corresponding to the voltage ranges aa or bb. The H2 disabling switch is closed in the input logic state corresponding to the cc voltage range. In this situation, when the input voltage $V_{in}$ crosses the $V_2$ trigger level in an upward direction from the bb range toward the cc range, the corresponding logic switch 502 will be disabled from driving its respective intermediate node $N_2$ HIGH and the logic control unit 504 will be blocked from sensing the upward crossing of the $V_2$ level. On the other hand, if the input voltage $V_{in}$ crosses the $V_2$ level in a downward direction from the cc range toward the bb range (disabling switch H2 is closed when $V_{in}$ is in the cc range), the corresponding $N_2$ node, which was driven HIGH during the input state corresponding to the cc range, will undergo a transition from the logic HIGH state to the logic LOW state and this transition will be supplied to the logic control unit 504 for recognition.

If it is desired to block the recognition of a downward crossing of, for example, the same $V_2$ level, the low drive disabling switch L2 is opened in either of the states corresponding to the cc or dd voltage ranges and the L2 switch is closed in the intermediate logic input state corresponding to the bb voltage range. Accordingly, when the input voltage $V_{in}$ crosses $V_2$ in a downward direction from the cc range toward the bb range, the logic switch 502 will be blocked from driving its corresponding intermediate node $N_2$ LOW and the logic control unit 504 will be prevented from recognizing that transition. For the reverse situation, when the input voltage $V_{in}$ crosses the $V_2$ threshold level upwardly from the bb range toward the cc range, the intermediate node $N_2$ which was driven LOW in the bb range state by the closing of the L2 disabling switch during that state, will undergo a LOW to HIGH transition. The logic control unit 504 will be able to recognize the latter transition and respond to it if desired by altering its output data $D_{out}$.

As stated previously, the foregoing detailed description is provided for the purpose of elucidating the general principles of the present invention and not for limiting its scope. It will, of course, be understood that modifications of the present invention, in its various aspects, will be apparent to those skilled in the art, some being apparent only after study and others being merely matters of routine electronic design and device fabrication. For example, such modifications may include the substitution of active devices such as bipolar transistors and/or junction FET's for the various insulated gate devices described above. Embodiments that are substantially different from those illustrated in the figures are of course also possible, with their specific designs being dependent upon a particular application. As such, the scope of the invention should not be limited by the particular embodiments described herein but should rather be defined by the appended claims and equivalents thereof.

I claim:

1. A unidirectional threshold crossing detector comprising:
    an input node;
    a first intermediate node;
    an output node;
    a first threshold activated logic switch, coupled to the input node and the first intermediate node so as to drive the first intermediate node towards a first logic state when an input signal applied to the input node surpasses a first threshold level;
    a second intermediate node;
    a second threshold activated logic switch, coupled to the input node and the second intermediate node so as to drive the second intermediate node towards a second logic state when the input signal surpasses a second threshold level;
    a first drive disabling switch, operatively coupled to the first threshold activated logic switch, for selectively disabling the first threshold activated logic switch from driving the first intermediate node towards the first logic state;
    a logic control means, coupled to the first and second intermediate nodes and the first drive disabling switch, for selectively operating the first drive disabling switch to disable the first threshold activated logic switch from driving the first intermediate node towards the first logic state and for producing a logical output signal, that is functionally related to the logic state of the first and second intermediate nodes, at the output node;
    threshold determining means for setting the first and second threshold levels of the first and second threshold activated logic switches independently of one another.

2. A unidirectional threshold crossing detector according to claim 1 wherein:
    the first and second threshold activated logic switches include respective first and second filed effect transistors (FET's) for driving the first and second intermediate nodes towards the first and second logic states, and
    the threshold determining means includes neutral point biasing means for supplying respective first and second neutral point biasing currents to the first and second FET's.

3. A unidirectional threshold crossing detector according to claim 2 wherein:
    the threshold determining means includes third and fourth FET's which are substantially mirror duplicates of respectively the first and second FET's, and a gate voltage setting means for supplying to the gates of the third and fourth FET's respective first and second threshold setting voltages.

4. A unidirectional threshold crossing detector according to claim 3 wherein the gate voltage setting means includes a voltage divider coupled to a precision voltage reference.

5. A unidirectional threshold crossing detector according to claim 1 wherein:
    the first and second threshold activated logic switches include respective first and second inverters drivingly coupled to the first and second intermediate nodes, and the logic control means includes a NOR gate that is responsive to the logic states of the first and second intermediate nodes.

6. A unidirectionally sensitive detection circuit for detecting the crossing of an input signal past a pre-selected level in a pre-selected direction, comprising:
    an input node (D) for receiving a supplied input signal;
    first and second intermediate nodes (E, F);
    an output node (G);
    a low threshold level activated switching means, responsive to the level of the input signal supplied at the input node (D) and drivingly coupled to the first intermediate node (E), for switching the first intermediate node between a logic LOW state and a logic HIGH state in response to the input signal crossing a selected low threshold level;
    a high threshold level activated switching means, responsive to the level of the input signal at the input node (D) and drivingly coupled to the second intermediate node (F), for switching the second intermediate node between the logic LOW and HIGH states in response to the input signal crossing a selected high threshold level;
    a logical combining means, responsive to the logic states of the first and second intermediate nodes (E, F) and drivingly coupled to the output node (G), for logically combining the logic states of the intermediate nodes to produce a functionally related output state at the output node (G); and
    a disabling means, which is responsive the output state at the output node (G), for selective disabling at least one of the switching means from driving its respective intermediate node (E, F) from a first of the LOW and HIGH logic states to a second after the output state is switched to a pre-established logic state so that the at least one of the low and high threshold activated switching means is disabled from changing the logic state of its respective intermediate node in response to the input signal crossing the corresponding one of the high and low threshold levels.

7. A Schmitt trigger circuit comprising:
    an input node (D) for receiving an input signal;
    first and second intermediate nodes (E, F);
    an output node (G);
    a first inverter, having an input coupled to the input node (D) and an output coupled to the first intermediate node (E), the first inverter being adapted to drive the first intermediate node (E) toward a logic LOW state when the input signal is above a lower threshold level and to drive the first intermediate node (E) toward a logic HIGH state when the input signal is below the lower threshold level;

a second inverter, having an input coupled to the input node (D) and an output coupled to the second intermediate node (F), the second inverter being adapted to drive the second intermediate node (F) toward the logic LOW state when the input signal is above an upper threshold level and to drive the second intermediate node (F) toward a logic HIGH state when the input voltage is below the upper threshold level;

a NOR gate, having inputs connected to the first and second intermediate nodes (E, F,) and an output coupled to the output node (G); and a drive disabling switch, coupled to the second inverter and responsive to the output of the NOR gate, the drive disabling switch being adapted to disable the second inverter from driving the second intermediate node (F) toward the logic HIGH state when the output of the NOR gate is at the logic HIGH state;

wherein the first and second inverters operate to draw substantially no power during at least one of the states of the input signal voltage being greater than the upper threshold level, the input signal voltage being less than the upper threshold level, the input signal voltage being greater than the lower threshold level and the input signal voltage being less than the lower threshold level.

8. A Schmitt trigger according to claim 7 further comprising
first and second biasing means for independently supplying respective first and second neutral-point biasing currents to the first and second inverters to thereby establish the upper and lower threshold levels.

9. A Schmitt trigger according to claim 8 wherein the first inverter has a first current leg for conducting the first neutral-point biasing current therethrough, the second inverter has a second current leg for conducting the second neutral-point biasing current therethrough, and
the first and second biasing means have respective first and second mirror legs, that are substantially mirror duplicates of the corresponding first and second current legs, for conducting respective first and second mirror currents.

10. A Schmitt trigger according to claim 9 wherein at least one of the first and second mirror legs includes a first voltage controlled current limiter means for controlling the magnitude of the mirror current flowing through the one mirror leg and a bias voltage generating means for transforming the mirror current of the one mirror leg into a biasing voltage, and further wherein the one mirror leg includes a bias-voltage to leg-current conversion means, connected to a corresponding one of the first and second current legs, for converting the bias voltage of the bias voltage generating means into the neutral-point biasing current of that corresponding one current leg.

11. A Schmitt trigger according to claim 10 wherein the bias voltage generating means includes a first field effect transistor (FET) and the bias-voltage to leg-current conversion means includes a second FET that is a duplicate of the first FET.

12. An integrated circuit chip having a plurality of Schmitt triggers according to claim 7 provided thereon and further comprising a biasing means, coupled to the plural Schmitt triggers, for setting their respective lower and upper threshold levels equal to corresponding ones of a first and second reference voltage.

13. An integrated circuit chip according to claim 12 wherein the biasing means includes a voltage divider for producing the first and second reference voltages.

14. A pulse width/pulse phase modulation circuit comprising:
a Schmitt trigger having independently adjustable low and high threshold levels;
input means for supplying a periodic wave function to an input of the Schmitt trigger; and
modulation means, coupled to the Schmitt trigger, for modulating at least one of the low and high threshold levels of the Schmitt trigger.

15. A Schmitt trigger circuit according to claim 7 wherein the first inverter is coupled to a power supply terminal and includes a power consumption reducing means, responsive to the input signal, for reducing current flow from the power supply terminal to the first inverter when the input signal is outside of a predetermined active range including the lower and upper threshold levels.

16. A unidirectional threshold crossing detector as claimed in claim 1, wherein:
the first threshold activated logic switch includes a first FET;
the second threshold activated logic switch includes a second FET of the same channel conductivity type as that of the first FET; and
the input node is coupled to the first and second FETs.

17. A Schmitt trigger circuit as claimed in claim 7, wherein:
the first inverter includes a first FET;
the second inverter includes a second FET of the same channel conductivity type as that of the first FET; and
the input node is coupled to the first and second FETs.

18. A unidirectional threshold crossing detector comprising:
an input node;
a first intermediate node;
an output node;
a first threshold activated logic switch, having a first FET coupled to the input node, the first threshold activated logic switch being coupled to the first intermediate node so as to drive the first intermediate node towards a first logic state when an input signal applied to the input node surpasses a first threshold level;
a second threshold activated logic switch having a second FET of the same channel conductivity type as that of the first FET, the second FET being coupled to the input node;
a first drive disabling switch, operatively coupled to the first threshold activated logic switch, for selectively disabling the first threshold activated logic switch from driving the first intermediate node towards the first logic state; and
a logic control means, coupled to the first intermediate node and the first drive disabling switch, for selectively operating the first drive disabling switch to disable the first threshold activated logic switch from driving the first intermediate node towards the first logic state, the logic control means producing a logical output signal, that is functionally related to the logic state of the first intermediate node, at the output node.

* * * * *